(12) United States Patent
Raben et al.

(10) Patent No.: US 12,381,135 B2
(45) Date of Patent: Aug. 5, 2025

(54) ELECTRONIC PACKAGE AND ELECTRONIC DEVICE COMPRISING THE SAME

(71) Applicant: Ampleon Netherlands B.V., Nijmegen (NL)

(72) Inventors: Jurgen Raben, Nijmegen (NL); Mariano Ercoli, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 513 days.

(21) Appl. No.: 17/906,794

(22) PCT Filed: Mar. 22, 2021

(86) PCT No.: PCT/EP2021/057325
§ 371 (c)(1),
(2) Date: Sep. 20, 2022

(87) PCT Pub. No.: WO2021/186085
PCT Pub. Date: Sep. 23, 2021

(65) Prior Publication Data
US 2023/0178464 A1 Jun. 8, 2023

(30) Foreign Application Priority Data
Mar. 20, 2020 (NL) .................................... 2025182

(51) Int. Cl.
*H01L 23/495* (2006.01)
*H01L 23/00* (2006.01)
(Continued)

(52) U.S. Cl.
CPC .. *H01L 23/49568* (2013.01); *H01L 23/49513* (2013.01); *H01L 23/49555* (2013.01);
(Continued)

(58) Field of Classification Search
None
See application file for complete search history.

(56) References Cited

U.S. PATENT DOCUMENTS 8,575,742 B1 * 11/2013 Kim .................. H01L 23/49541
257/730
9,362,211 B1 * 6/2016 Gao .................. H01L 23/49503
(Continued)

FOREIGN PATENT DOCUMENTS

WO 2019/064431 A1 4/2019

OTHER PUBLICATIONS

PCT International Search Report and Written Opinion, Application No. PCT/EP2021/057325, mailed Jul. 19, 2021, 10 pages.

*Primary Examiner* — Cory W Eskridge
(74) *Attorney, Agent, or Firm* — McDonnell Boehnen Hulbert & Berghoff LLP

(57) ABSTRACT

Example embodiments relate to electronic packages and electronic devices that include the same. One embodiment includes an electronic package. The electronic package includes a package body. The electronic package also includes a heat-conducting substrate arranged inside the package body and having a bottom surface that is exposed to an outside of the package body. Additionally, the electronic package includes an electronic circuit arranged inside the package body and including a semiconductor die that has a bottom surface with which it is mounted to the heat-conducting substrate and an opposing upper surface. Further, the electronic package includes one or more leads partially extending from outside the package body to inside the package body and over the minimum bounding box, each lead having a first end that is arranged inside the package body. In addition, the electronic package includes one or more bondwires for connecting the first end(s) to the electronic circuit.

20 Claims, 6 Drawing Sheets

(51) Int. Cl.
*H05K 1/02* (2006.01)
*H01L 23/055* (2006.01)
*H01L 23/31* (2006.01)

(52) U.S. Cl.
CPC ............ *H01L 24/48* (2013.01); *H01L 24/49* (2013.01); *H05K 1/0204* (2013.01); *H05K 1/021* (2013.01); *H01L 23/055* (2013.01); *H01L 23/3121* (2013.01); *H01L 24/32* (2013.01); *H01L 24/73* (2013.01); *H01L 2224/32221* (2013.01); *H01L 2224/48091* (2013.01); *H01L 2224/48101* (2013.01); *H01L 2224/48175* (2013.01); *H01L 2224/49175* (2013.01); *H01L 2224/73265* (2013.01); *H05K 2201/10166* (2013.01); *H05K 2201/10757* (2013.01); *H05K 2201/10818* (2013.01)

(56) References Cited

U.S. PATENT DOCUMENTS

| | | | |
|---|---|---|---|
| 2004/0113248 A1* | 6/2004 | Ito ........................ | H05K 3/3426 |
| | | | 257/E23.092 |
| 2013/0017652 A1* | 1/2013 | Tsui ....................... | H01L 24/49 |
| | | | 438/118 |
| 2014/0077345 A1* | 3/2014 | Uno .................. | H01L 23/49568 |
| | | | 257/664 |

\* cited by examiner

ELECTRONIC PACKAGE AND ELECTRONIC DEVICE COMPRISING THE SAME

CROSS-REFERENCE TO RELATED APPLICATIONS

The present application is a national stage entry of PCT/EP2021/057325 filed Mar. 22, 2021, which claims priority to NL 2025182 filed Mar. 20, 2020, the contents of each of which are hereby incorporated by reference.

The present invention relates to an electronic package. The present invention further relates to an electronic device comprising the same.

Electronic packages as defined by the preamble of claim 1 are known in the art. These packages typically comprise a package body, and a heat-conducting substrate that is arranged inside the package body and that has a bottom surface that is exposed to an outside of the package body. The heat-conducting substrate has associated therewith a minimum bounding box that surrounds the heat-conducting substrate.

In these packages, an electronic circuit is arranged inside the package body. The circuit comprises a semiconductor die that has a bottom surface with which it is mounted to the heat-conducting substrate and an opposing upper surface. The electronic circuit may for example comprise a power amplifier. Such power amplifier could comprise transistors arranged and/or integrated in the semiconductor die and passive circuitry in the form of surface mounted devices arranged on the heat-conducting substrate. The passive circuitry could equally be realized the semiconductor die and/or on further semiconductor dies arranged in the same package.

The known electronic package further comprises one or more leads partially extending from outside the package body to inside the package body, and over the minimum bounding box, each lead having a first end that is arranged inside the package body. One or more bondwires are used for connecting the first end(s) to the electronic circuit.

FIGS. 1A and 1B illustrate a cross sectional view and a top view, respectively, of a known package. The known package comprises a package body 3 in which a heat-conducting substrate 1 is arranged. Heat-conducting substrate 1 is connected to a semiconductor die 2 via an intermediate layer 2A, such as a solder layer. Furthermore, a bottom surface 1A of heat-conducting substrate 1 is exposed to an outside of package body 3. Typically, bottom surface 1A is mounted to a heat-conducting substrate, such as a coin, in a printed-circuit board on which the package is mounted. In some embodiments, semiconductor die 2 comprises an electrically conductive substrate. In such cases, electrical grounding of the circuitry on semiconductor die 2 can be realized through the substrate and through the heat-conducting substrate 1. In non-conductive substrates, one or more vias in the substrate can be used for electrical grounding.

A lead 4 provides electrical connection to the circuitry on semiconductor die 2. At a first end 4A, lead 4 is connected to the circuitry on semiconductor die 2 via a bondwire 5. Lead 4 and substrate 1 should be spaced apart to avoid inadvertent electrical short circuits.

A minimum bounding box can be defined that surrounds heat-conducting substrate 1. The cross section of this bounding box when taken parallel to bottom surface 1A equals a quadrangle E1. As shown in FIGS. 1A and 1B, leads 4 extend above and over this bounding box and quadrangle E1 by a length E2.

A drawback of the electronic packages of the type describe above is related to the inductance associated with bondwires 5. Typically, bondwires 5 are used to connect the input and output of the electronic package. As such, these connections are very sensitive to inductive coupling. It is therefore preferred to be able to accurately control the inductance of these bondwires. More in particular, it is preferred to minimize the area in between heat-conducting substrate 1 and bondwire 5 to avoid inductive coupling as much as possible. Unfortunately, with the known packages, a considerable area still remains.

It is an object of the present invention to provide an electronic package in which the abovementioned problem does not or hardly occur.

This object is achieved with the electronic package according to claim 1 that is characterized in that upper surface(s) of the first end(s) of the one or more leads substantially lie(s) in a plane with the upper surface of the semiconductor die, wherein the plane is parallel to the bottom surface of the heat-conducting substrate, and in that the heat-conducting substrate comprises one or more recesses or cut-outs underneath the one or more leads.

By having one or more recesses or cut-outs underneath the one or more leads it becomes possible to lower the one or more leads to the level of the semiconductor die without jeopardizing an electrical short between the one or more leads and the heat-conducting substrate. Furthermore, because the upper surfaces of the first end(s) of the one or more leads is/are now at substantial the same height position as the upper surface of the semiconductor die, it becomes possible to use bondwire shapes that are less prone to inductive coupling.

A difference in vertical offset relative to the bottom surface of the heat-conducting substrate of a) the upper surface(s) of the first end(s) of the one or more leads and b) the upper surface of the semiconductor die can be less than 300 micrometer, preferably less than 150 micrometer, and more preferably less than 50 micrometer.

The one or more leads may comprise one or more input leads, wherein the electronic circuit comprises an input that is connected to the first end(s) of the one or more input leads, for example using one or more bondwires. Additionally or alternatively, the one or more leads may comprise one or more output leads, wherein the electronic circuit comprises an output that is connected to the first end(s) of the one or more output leads, for example using one or more bondwires. The number, shape, and/or thickness of the input and output leads may differ. For example, for power amplifier packages, the combined cross-sectional area of the output leads is typically larger than that of the input leads to allow large output current to flow. Furthermore, the semiconductor die may comprise respective bondpads or bondbars for bonding the one or more bondwires.

The one or more recesses or cut-outs for the one or more input leads can be formed as a single continuous recess or cut-out arranged at a first side of the heat-conducting substrate. Additionally or alternatively, the one or more recesses or cut-outs for the one or more output leads can be formed as a single continuous recess or cut-out arranged at a second side of the heat-conducting substrate opposite to the first side.

The one or more recesses or cut-outs for the one or more input leads and for the one or more output leads may comprise a continuous recess extending along an entire perimeter of the heat-conducting substrate.

Alternatively, the one or more recesses or cut-outs for the one or more input leads can be formed as a plurality of spaced apart recesses or cut-outs arranged at a first side of the heat-conducting substrate, and/or the one or more recesses or cut-outs for the one or more output leads can be formed are formed as a plurality of spaced apart recesses or cut-outs arranged at a second side of the heat-conducting substrate opposite to the first side. The present invention does not exclude that additional recesses or cut-outs are provided on other sides of the heat-conducting substrate and that one or more bondwires may be provided similar to the bondwires for the first and second side of the heat-conducing substrate.

Each lead among the one or more leads can be associated with a different recess or cut-out among the one or more recesses or cut-outs. Additionally or alternatively, recesses and cut-outs can be used simultaneously. For example, for a subset of leads arranged on the same side of the heat-conducting substrate, recesses may be provided whereas for another subset of leads arranged on that same side, cut-outs can be used.

The semiconductor die may comprise a bottom surface that is connected to the heat-conducting substrate and a top surface opposite to the bottom surface. The electronic circuit may comprise one or more transistors integrated in the semiconductor die at or near the upper surface, and the bottom surface being physically connected to the heat-conducting substrate. This latter connection is typically facilitated by an additional layer such as a solder layer. The one or more transistors may comprise one or more RF power transistors. The one or more transistors may comprise a Silicon based laterally diffused metal-oxide-semiconductor, 'LDMOS', transistor, and/or a Gallium Nitride based field-effect transistor, 'FET'.

The semiconductor die may comprise a conductive substrate for allowing the one or more transistors to be grounded through the conductive substrate and heat-conducting substrate. Alternatively, the semiconductor die may comprise a substrate in which one or more vias are arranged for allowing the one or more transistors to be grounded through the one or more vias and heat-conducting substrate A thickness of the one or more leads is typically greater than a thickness of the semiconductor die. For example, for RF power applications, the thickness of the leads typically ranges from 0.1 mm to 0.4 mm, whereas the thickness of the semiconductor die typically ranges from 50 to 200 micrometer. Here, it is noted that having a small thickness for the semiconductor die can be advantageous for heat transportation from the semiconductor die to the heat-conducting substrate. Secondly, the semiconductor die may have a conductive substrate allowing ground connection for the electronic circuits arranged on the top surface of the semiconductor die. An example of such connection is the source connection to ground for transistors. By having a relatively thin semiconductor die, a low source inductance can be obtained.

Some or all of the one or more leads may extend substantially entirely parallel to the bottom surface of the heat-conducting substrate. Alternatively, some or all of the one or more leads may enter the package body at a height position relative to the bottom surface of the heat-conducting substrate that is greater than a height position of the first end(s) of those leads relative to the bottom surface of the heat-conducting substrate. In this latter case, each lead among the some or all of the one or more leads may comprise a first lead part that extends at least partially outside the package body and preferably substantially parallel to the bottom surface of the heat-conducting substrate, and a second lead part that extends inside the package body and substantially parallel to the bottom surface of the heat-conducting substrate. Each lead may further comprise a curved lead part that extends at least partially inside the package body and that connects the first and second lead parts. Such curved part is also known as lead downset. It should however be noted that the present invention equally relates to embodiments in which the leads are straight. In those embodiments, the height position at which the leads enter the package is identical to the height position of the first ends of those leads.

First lead part may have a curved shape to obtain a desired package stand-off height. For example, first lead part may bend downwards toward the bottom of the package. For example, the leads may have a gull-wing configuration.

The package body may comprise an air cavity in which the semiconductor die and the first end(s) of the one or more leads are arranged. Air has a low dielectric constant and therefore presents low capacitive coupling. In such packages, a spacer element can be provided for ensuring that the one or more leads and the heat-conducting substrate are spaced apart. This spacer element can for example comprise a ceramic ring or a thermoplastic ring. Alternatively, the spacer element is formed by a solidified molding compound through which the one or more leads extend. In both cases, the package may comprise a package lid that is connected to the spacer element and that delimits the air cavity. Additionally or alternatively, the spacer element and/or lid can be made from thermo-set materials, such as Duroplast or molding compounds suitable for injection or transfer molding, or thermo-plast materials such as liquid crystal polymers.

The package body can be formed by a solidified molding compound that fills the inside of the package body and that contacts the semiconductor die and the one or more leads. These types of packages present a cost advantage as no additional package lid is required.

The one or more leads were parts of a lead frame that was used for the manufacturing of the electronic package, wherein prior to separating the electronic package, the one or more leads and the heat-conducting substrate were connected to a remainder of the lead frame. Typically, lead frames are used for simultaneously manufacturing a plurality of packages. These lead frames comprise a set of leads, both input and output, and a heat-conducting substrate for each package to be manufactured. Prior to separating the packages from the lead frame, the heat-conducting substrates are still connected to a remainder of the lead frame using so-called tie bars. These tie bars are small metal connections between the heat-conducting substrate and the remainder of the lead frame. Separating the electronic packages may comprise breaking the connection between the one or more leads and the remainder of the lead frame and between the heat-conducting substrate and the remainder of the lead frame. After separating the electronic packages, the electronic package may comprise tie bar remnants connected at corners of the heat-conducting substrate. It should be noted that the present invention equally relates to embodiments in which the heat-conducting substrate is connected to the remainder of the lead frame in other ways, such as gluing, soldering, or welding.

According to a further aspect, the present invention provides an electronic device that comprises the electronic package as described above, wherein the one or more leads each have a mounting end opposite from the first end. The electronic device further comprises a printed circuit board having a ground pad that is electrically and physically connected to the heat-conducting substrate, and one or more signal pads that are electrically and physically connected to the mounting end(s) of the one or more leads.

The printed circuit board may comprise multiple layers, wherein the ground pad is formed at an inner layer, and wherein the signal pads are formed at an outer layer, wherein the ground pad has been exposed to an outside by removal of the layer(s) above the ground plane. The ground plane can be formed by a top surface of a coin that is integrated in the printed circuit board. Within the context of the present invention, a coin is made from material having a much higher thermal conductivity than that of the printed circuit board. The coin can for example be made of Copper. For arranging the coin, the printed circuit board can be provided with an opening or recess in which the coin is mounted. Such opening may even fully extend through the printed circuit board. The coin is preferably connected to the heat-conducting substrate of the electronic package of the invention.

Next, the present invention will be described with reference to the appended drawings, wherein.

Figure 4A:
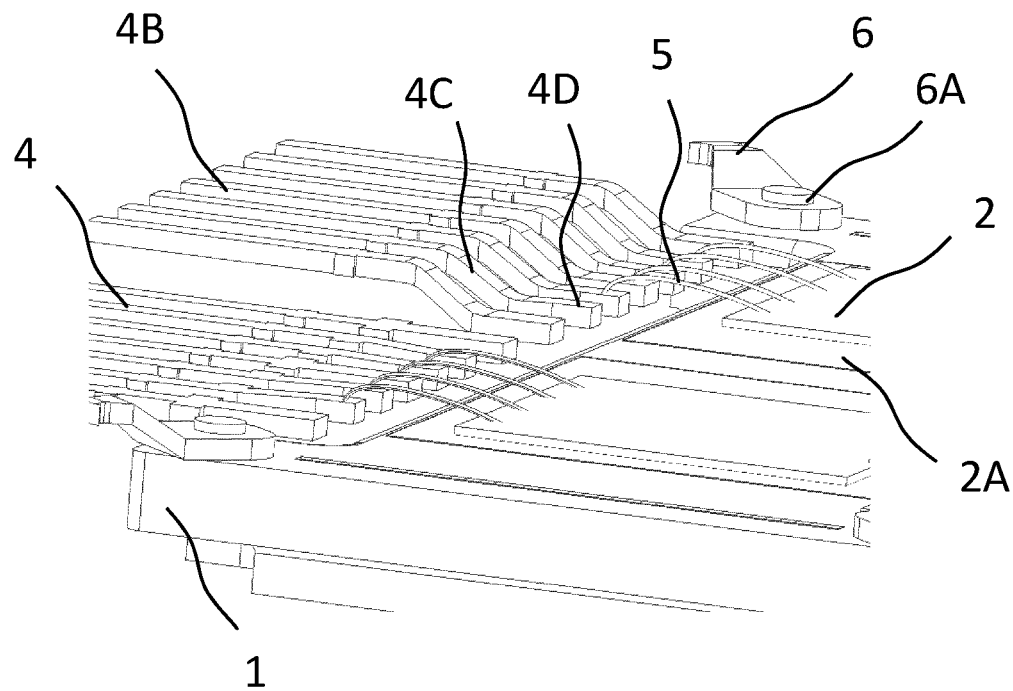
Figure 4B:
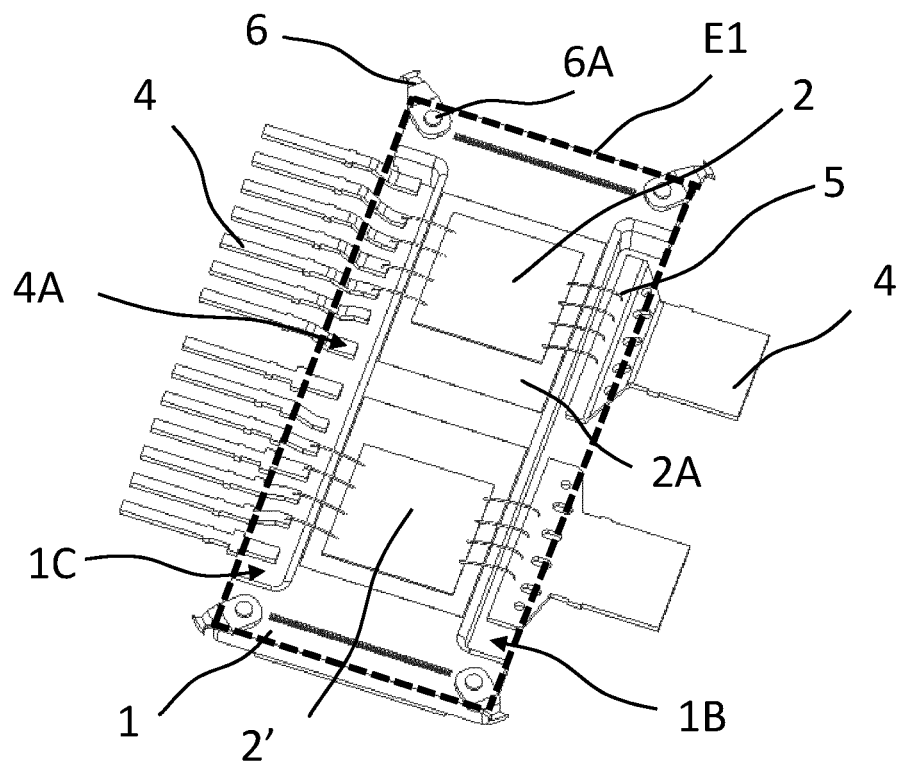
Figure 5A:
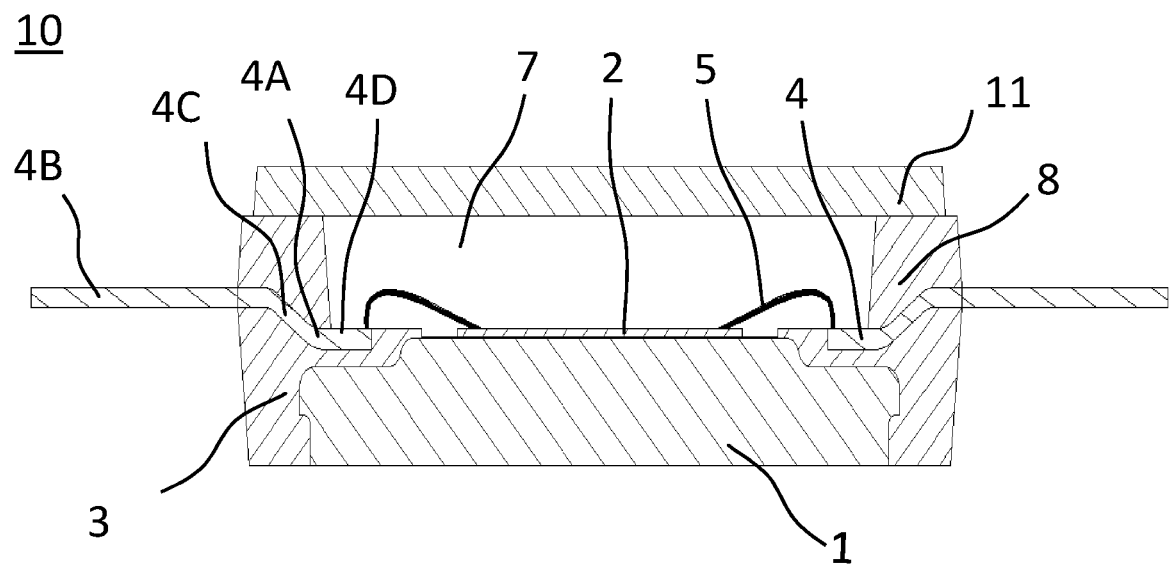
Figure 5B:
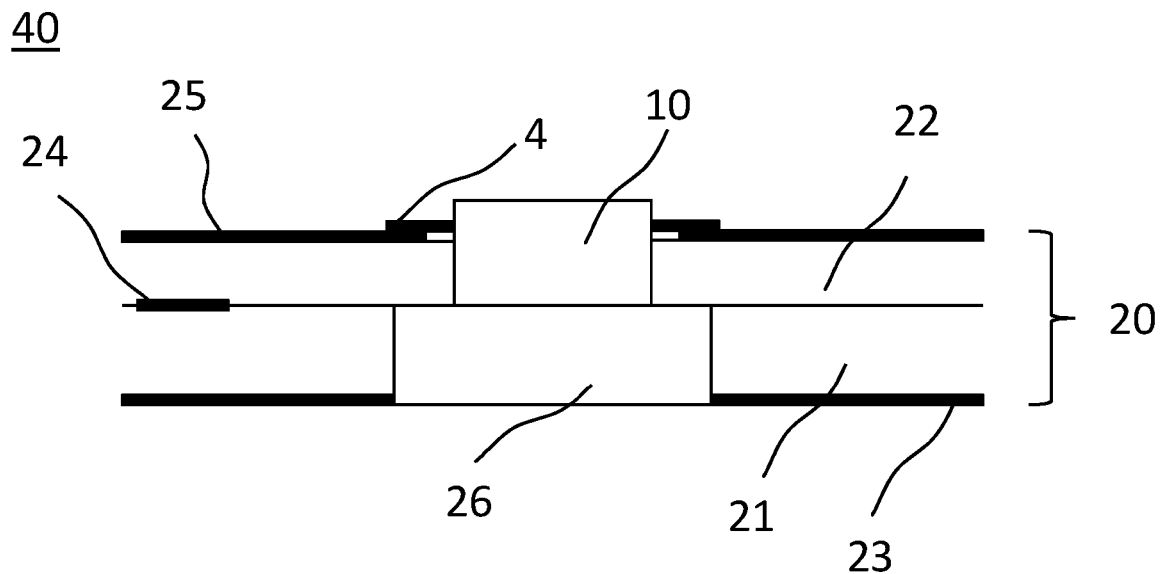
Figure 6A:
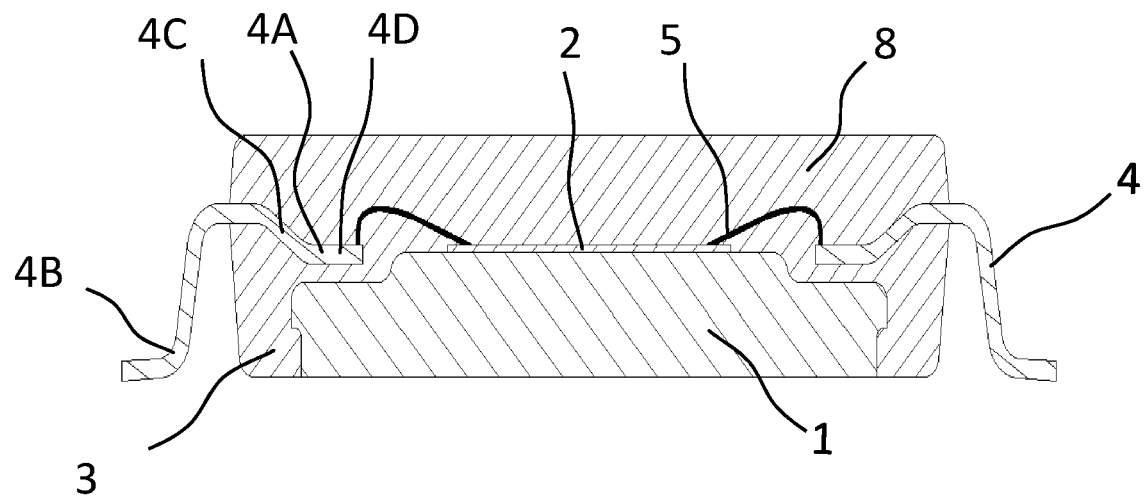
Figure 6B:
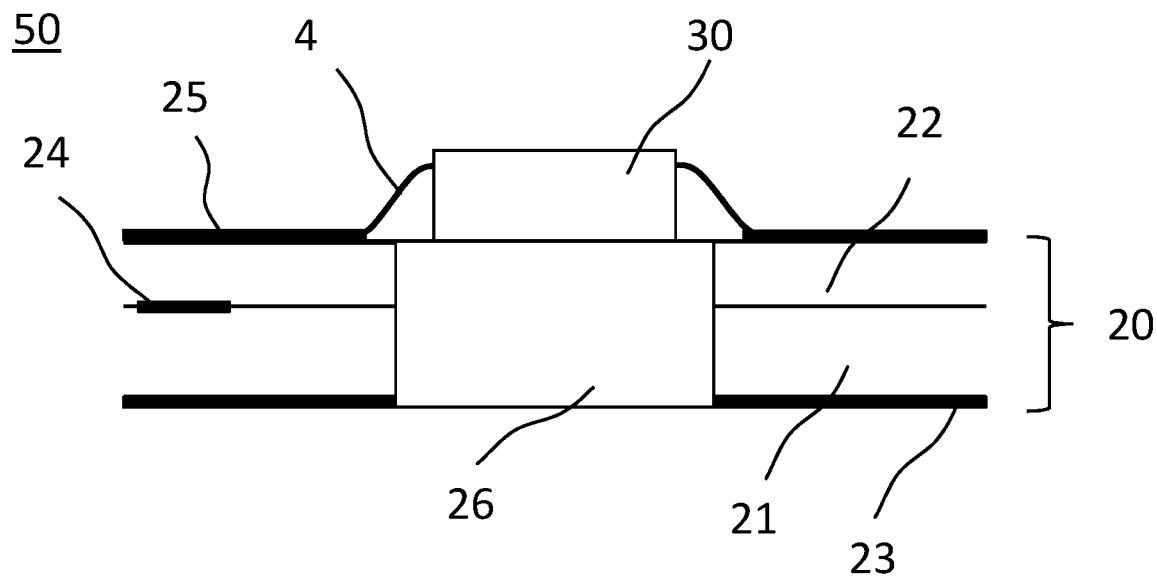

FIGS. 4A and 4B present perspective views of an embodiment of an electronic package according to the present invention in which the heat-conducting substrate is provided with a cut-out and in which straight leads and leads with a downset are used;

FIG. 5A illustrates a cross-sectional view of an embodiment of an electronic package in accordance with the present invention in which an air cavity is used and FIG. 5B illustrates an embodiment of an electronic device in accordance with the present invention in which the electronic package of FIG. 5A is used; and FIG. 6A illustrates a cross-sectional view of a further embodiment of an electronic package in accordance with the present invention in which the package body is filled with solidified molding compound and FIG. 6B illustrates a further embodiment of an electronic device in accordance with the present invention in which the electronic package of FIG. 6B is used.

Figure 1A:
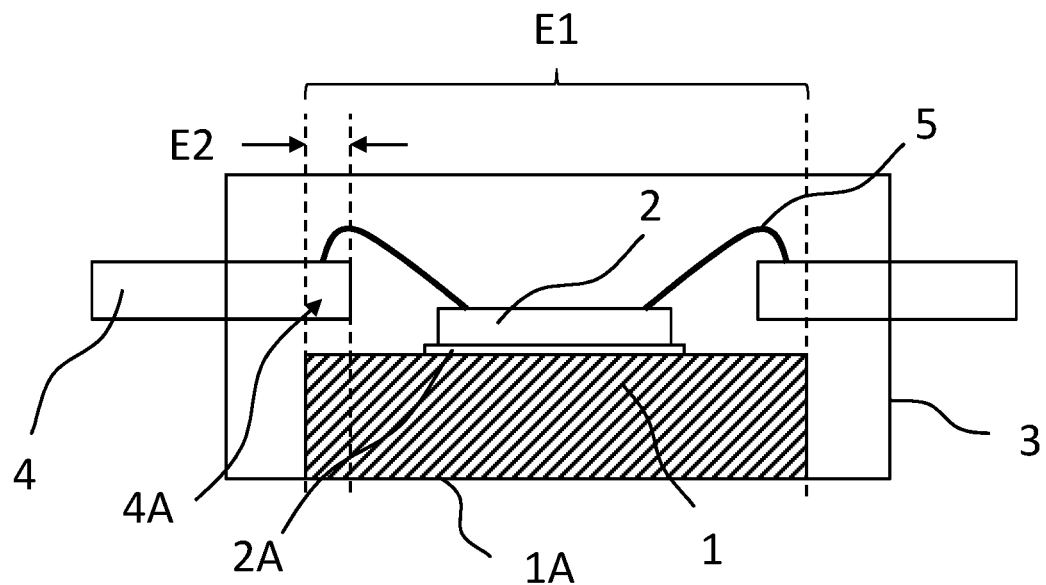
FIGS. 1A and 1B illustrate a cross sectional view and a top view, respectively, of a known electronic package.
Figure 1B:
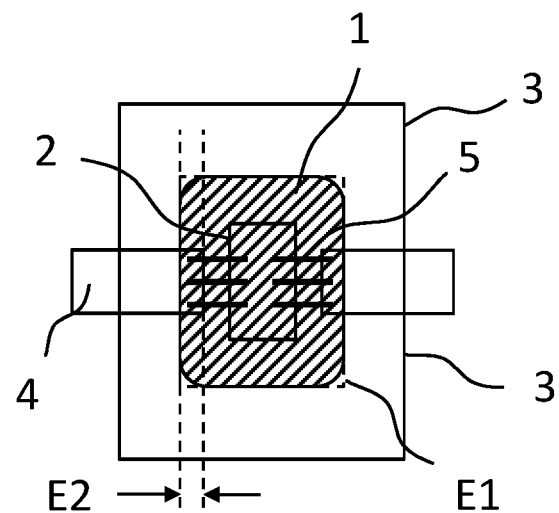
Figure 2A:
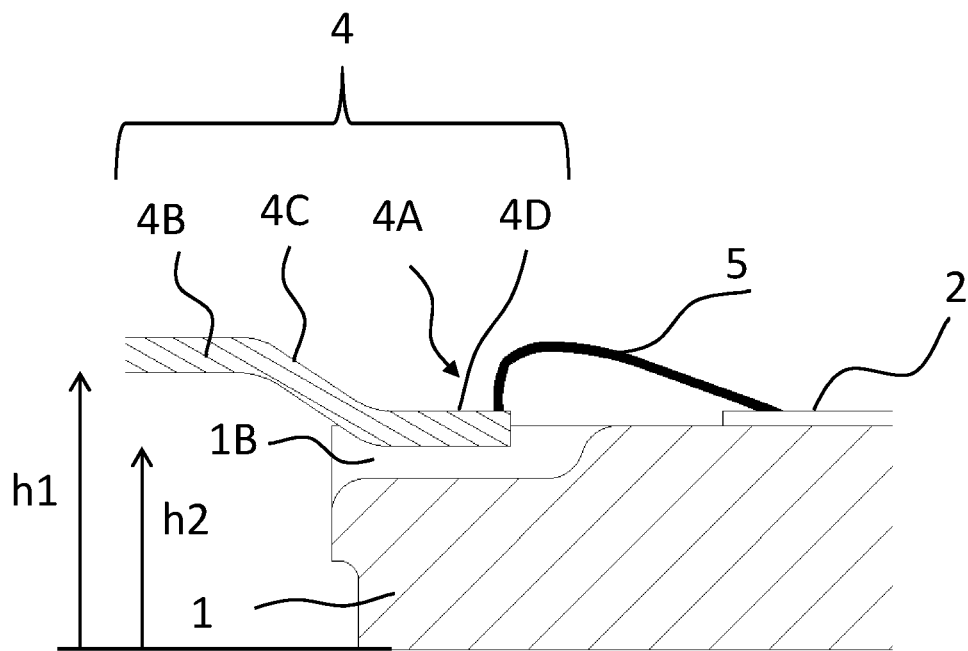
FIGS. 2A and 2B illustrate a cross-sectional view of an embodiment of an electronic package according to the present invention using a recess in the heat-conducting substrate for a lead having a downset, and a straight lead, respectively.
Figure 2B:
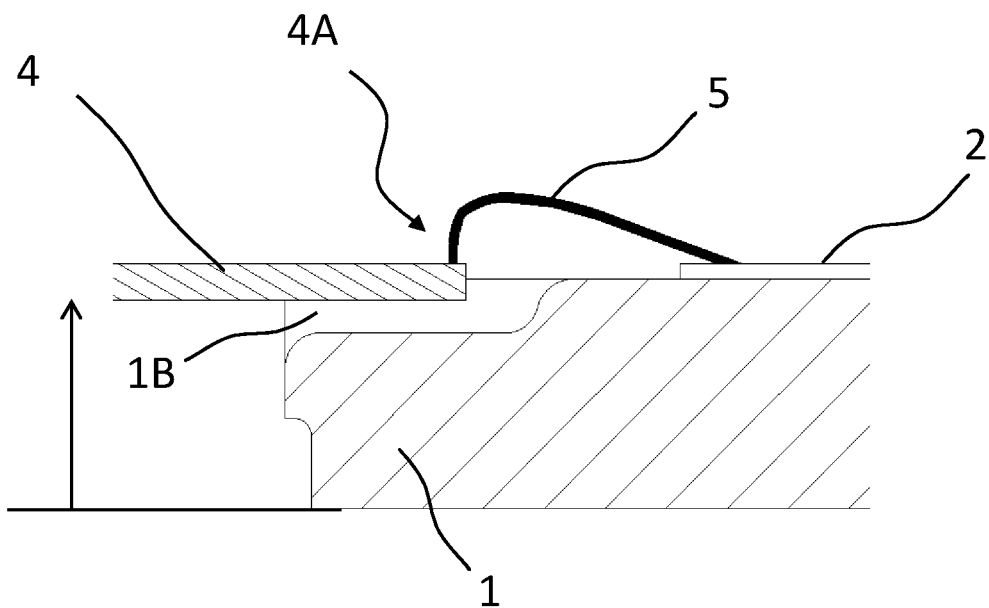

FIGS. 2A and 2B illustrate a cross-sectional view of an embodiment of an electronic package in accordance with the present invention using a recess 1B in heat-conducting substrate 1 for a lead 4 having a downset 4C, and a straight lead 4, respectively. As illustrated in FIG. 2A, lead 4 comprises a first lead part 4B, a second lead part 4D, and a downset 4C connecting lead parts 4B, 4D.

Lead part 4B extends at least partially outside the package body (not shown). As shown, downset 4C allows a height position h1 at which lead 4 enters the package body to be greater than a height position h2 of first end 4A relative to the bottom surface of heat-conducting substrate 1.

On the other hand, lead 4 in FIG. 2B is a straight lead. For this package, the package stand-off height, denoted by h1, is lower than that of the package in FIG. 2A. As will be explained later, the package stand-off height is important for packages that are partially arranged in a recess of a printed circuit board.

Figure 3A:
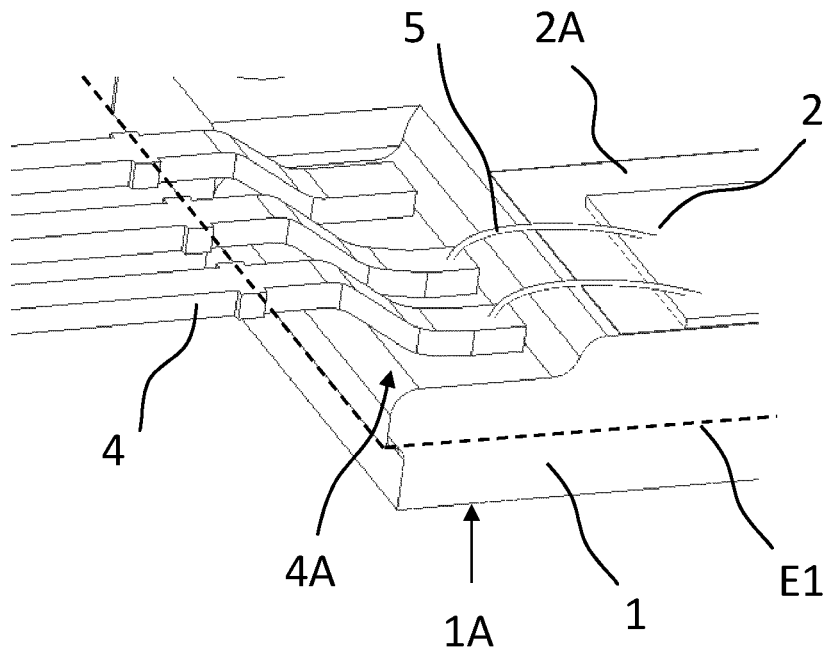
FIGS. 3A and 3B are perspective views corresponding to the embodiments of FIGS. 2A and 2B, respectively.
Figure 3B:
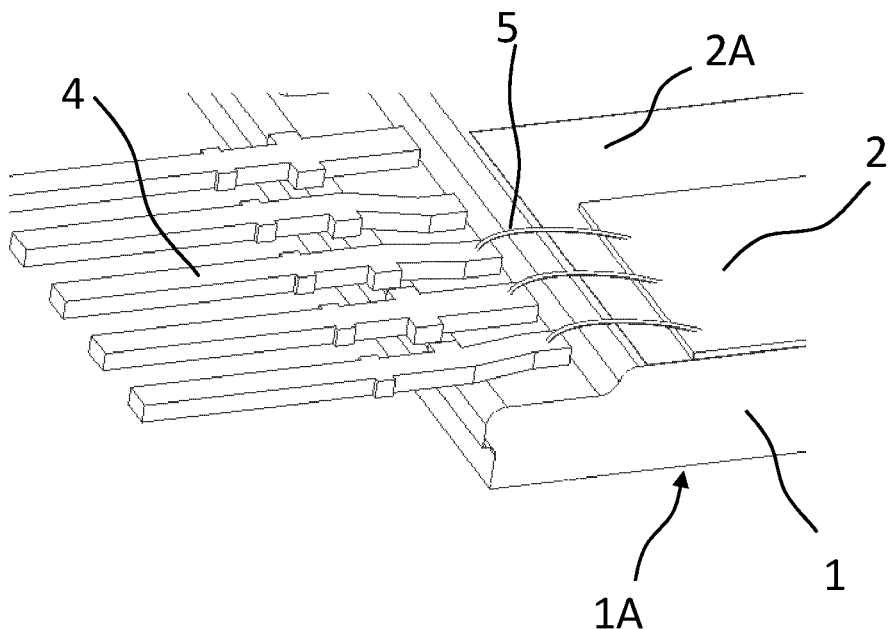

FIGS. 3A and 3B are perspective views corresponding to the embodiments of FIGS. 2A and 2B, respectively. Here, a layer 2A, e.g. solder layer, is shown for mounting semiconductor die 2 on heat-conducting substrate 1. Furthermore, FIG. 3A illustrates a part of a smallest rectangle E1 that surrounds heat-conducting substrate 1 and that is parallel to bottom surface 1A of heat-conducting substrate 1. A similar rectangle is shown in connection with FIG. 4B. In both cases, leads 4 partially extend partially over smallest rectangle E1.

FIGS. 4A and 4B present perspective views of an embodiment of an electronic package in accordance with the present invention in which heat-conducting substrate 1 is provided with a cut-out 1C and in which straight leads 4 and leads 4 with a downset 4C are used.

FIG. 4B illustrates a smallest rectangle E1 that surrounds heat-conducting substrate 1. Rectangle E1 is parallel to a bottom surface 1A of heat-conducting substrate 1. The end section of each lead, e.g. lead part 4D, extends over rectangle E1. In this region, a cut-out 1C is used to avoid electrical contact between leads 4 and heat-conducting substrate 1.

The embodiment shown in FIG. 4B may relate to a Doherty amplifier, wherein the main and optionally one or more of the peak amplifiers are arranged on a first semiconductor die 2, whereas the other peak amplifiers are arranged on the other semiconductor die 2'. Furthermore, leads 4 at the output, i.e. the side on the right in FIG. 4B, are much wider than leads 4 at the input to allow large currents to flow.

As shown in FIG. 4B, a cut-out 1C may be provided on opposite sides of the package. However, the present invention is not limited to such configuration. For example, a cut-out or recess may be provided on only one side. Alternatively, a cut-out may be provided on one side whereas a recess is provided on the other side.

FIGS. 4A and 4B also illustrate remnants 6 of a tie bar by which heat-conducting substrate 1 was connected at the time of simultaneously forming a plurality of packages. Each tie bar was and is connected to heat-conducting substrate 1 using a rivet 6A.

FIG. 5A illustrates a cross-sectional view of an embodiment of an electronic package 10 in accordance with the present invention in which an air cavity is used, and FIG. 5B illustrates an embodiment of an electronic device 40 in accordance with the present invention in which the electronic package of FIG. 5A is used.

Package 10 shown in FIG. 5A comprises an air cavity 7. It further comprises input and output leads 4, a heat-conducting substrate 1, and a semiconductor die 2. Heat-conducting substrate 1 is kept spaced apart from leads 4 by means of a solidified molding compound 8. Package 10 further comprises a package lid 11 that is connected to solidified molding compound 8. Solidified molding compound 8, heat-conductive substrate 1, and package lid 11 together define the outside surface of package body 3.

Package 10 comprises straight input and output leads 4. As illustrated, leads 4 comprise a first lead part 4B that mainly extends outside of package body 3, a downset 4C that is arranged inside package body 3, and a second lead part 4D of which an end 4A is exposed inside air cavity 7. This allows bondwires 5 to connect between leads 4 and the circuitry on semiconductor die 2. As shown, end 4A of lead 4 lies substantially in plane with the top surface of semiconductor die 2. Consequently, bondwires 5 between end 4A and the circuitry on semiconductor die 2 can be arranged with a very low profile. Such profile results in a low self-inductance of bondwire 5 and reduces the susceptibility for electromagnetic coupling with other bondwires in package 10.

In FIG. 5B, package 10 is mounted on a printed circuit board, 'PCB', 20 that comprises two dielectric layers. A first dielectric layer 21 forms the bottom part of PCB 20 and a second dielectric layer 22 forms the top part of PCB 20. On and in between layers 21, 22, metal layers are available. For example, a first metal layer 23 is arranged on dielectric layer 21, a second metal layer 24 is arranged in between dielectric layers 21, 22, and a third metal layer 25 is arranged on second dielectric layer 22. It should be clear to the skilled person that the invention is not limited to these dielectric layers and metal layers and that other PCBs would be equally possible with more or less metal layers and dielectric layers.

PCB 20 is provided with a coin 26 that is made of material having a high coefficient of thermal conductivity, e.g. Copper. Coin 26 is provided inside a cavity inside first dielectric layer 21. A further cavity is provided inside second dielectric layer 22, in which cavity package 10 is arranged.

The backside of package 10 is formed by the exposed part of heat-conducting substrate 1. This substrate is connected, e.g. by means of soldering, to coin 26 that defines a ground pad. At the same time, leads 4 connect to signal pads formed in third metal layer 25. As shown in FIG. 5B, the package stand-off height typically corresponds to the combined thickness of second dielectric layer 22 and third metal layer 25. However, due to the use of downset 4C, end 4A of lead 4 can be arranged to be in plane with the top surface of semiconductor die 2.

FIG. 6A illustrates a cross-sectional view of a further embodiment of an electronic package 30 in accordance with the invention. On the other hand, FIG. 6B illustrates an electronic device 50 comprising electronic package 30. Compared to package 10 in FIG. 5A, package 30 is fully filled with solidified molding compound 8. To manufacture such package, semiconductor die 2 has to be mounted to heat-conducting substrate 1 prior to applying the molding compound. Bondwires 5 also have to be arranged to connect leads 4 to the circuitry on semiconductor die 2 before applying the molding compound.

In FIG. 6A, leads 4 have a different, non-straight, shape. More in particular, leads 4, and more in particular, first lead parts 4B, have a curved shape that brings an end of leads 4 to roughly the same level as a bottom surface of package 30. This shape allows package 30 to be mounted on a PCB 20 as shown in FIG. 6B. PCB 20 can be configured identical to PCB 20 of FIG. 5B with the exception that coin 26 completely extends through PCB 20 by means of corresponding cavities in first and second dielectric layers 21, 22. In this manner, all connections between electronic package 30 and PCB 20 are realized on the level of third metal layer 25.

PCB 20 in FIG. 6B also comprises signals pads to which bondwires 5 are connected. The thermal connection between heat-conducting substrate 1 and coin 26 is ensured by mounting heat-conducting substrate 1 on coin 26, which acts as a ground pad, optionally via one or more mounting layers.

As shown in FIG. 6A, end 4A and the top surface of semiconductor die 2 lie in a plane that is parallel to a bottom surface of heat-conducting substrate 1.

In the above, the present invention has been explained using detailed embodiments thereof. However, it should be appreciated that the invention is not limited to these embodiments and that various modifications are possible without deviating from the scope of the present invention, which is defined by the appended claims.

LIST OF REFERENCE SIGNS

E1 Smallest quadrangle
E2 Overlap lead and smallest quadrangle
1. Heat-conducting substrate
1A. Bottom surface heat-conducting substrate
1B. Recess
1C. Cut-out
2, 2'. Semiconductor substrate
2A. Solder layer
3. Package body
4A. First end of lead
4B. First lead part
4C. Downset
4D. Second lead part
5. Bondwire
6. Tie bar remnant
6A. Rivet
7. Air cavity
8. Solidified molding compound
10. Electronic package
11. Package lid
20. PCB
21. First dielectric layer
22. Second dielectric layer
23. First metal layer
24. Second metal layer
25. Third metal layer
26. Coin
30. Electronic package
40. Electronic device
50. Electronic device

The invention claimed is:
1. An electronic package comprising:
a package body;
a heat-conducting substrate arranged inside the package body and having a bottom surface that is exposed to an outside of the package body, the heat-conducting substrate having associated therewith a minimum bounding box that surrounds the heat-conducting substrate;
an electronic circuit arranged inside the package body and comprising a semiconductor die that has a bottom surface with which it is mounted to the heat-conducting substrate and an opposing upper surface;
one or more leads partially extending from outside the package body to inside the package body and over the minimum bounding box, each lead having a first end that is arranged inside the package body; and
one or more bondwires for connecting the first end(s) to the electronic circuit,
wherein the heat-conducting substrate comprises one or more recesses or cut-outs underneath the one or more leads,
wherein upper surface(s) of the first end(s) of the one or more leads substantially lie in a plane with the upper surface of the semiconductor die, said plane being parallel to the bottom surface of the heat-conducting substrate,
wherein the one or more leads were parts of a lead frame that was used for the manufacturing of the electronic package,
wherein prior to separating the electronic package, the one or more leads and the heat-conducting substrate were connected to a remainder of the lead frame,
wherein said separating comprises breaking the connection between the one or more leads and the remainder of the lead frame and between the heat-conducting substrate and the remainder of the lead frame,
wherein the electronic package comprises tie bar remnants connected at corners of the heat-conducting substrate,
wherein prior to separating the electronic package, the heat-conducting substrate was connected to the remainder of the lead frame using the tie bars,
wherein some or all of the one or more leads enter the package body at a height position relative to the bottom surface of the heat-conducting substrate that is greater than a height position of the first end(s) of those leads relative to the bottom surface of the heat-conducting substrate, and
wherein each lead among said some or all of the one or more leads comprises:
  a first lead part that extends at least partially outside the package body and substantially parallel to the bottom surface of the heat-conducting substrate;
  a second lead part that extends inside the package body and substantially parallel to the bottom surface of the heat-conducting substrate; and
  a curved lead part that extends at least partially inside the package body and that connects the first and second lead parts.

2. The electronic package according to claim 1, wherein a difference in vertical offset relative to the bottom surface of the heat-conducting substrate of the upper surface(s) of the first end(s) of the one or more leads and the upper surface of the semiconductor die is less than 50 micrometers.

3. The electronic package according to claim 1, wherein the one or more leads comprise one or more input leads, and wherein the electronic circuit comprises an input that is connected to the first end(s) of the one or more input leads.

4. The electronic package according to claim 3, wherein the one or more recesses or cut-outs for the one or more input leads are formed as a plurality of spaced apart recesses or cut-outs arranged at a first side of the heat-conducting substrate.

5. The electronic package according to claim 3, wherein the one or more recesses or cut-outs for the one or more input leads are formed as a single continuous recess or cut-out arranged at a first side of the heat-conducting substrate.

6. The electronic package according to claim 5, wherein the one or more recesses or cut-outs for the one or more input leads comprise a continuous recess extending along an entire perimeter of the heat-conducting substrate.

7. The electronic package according to claim 1, wherein the one or more leads comprise one or more output leads, and wherein the electronic circuit comprises an output that is connected to the first end(s) of the one or more output leads.

8. The electronic package according to claim 7, wherein the one or more recesses or cut-outs for the one or more output leads are formed as a plurality of spaced apart recesses or cut-outs arranged at a second side of the heat-conducting substrate.

9. The electronic package according to claim 8, wherein the one or more recesses or cut-outs for the one or more output leads are formed as a single continuous recess or cut-out arranged at a second side of the heat-conducting substrate, and wherein the one or more recesses or cut-outs for the one or more output leads comprise a continuous recess extending along an entire perimeter of the heat-conducting substrate.

10. The electronic package according to claim 1, wherein each lead among the one or more leads is associated with a different recess or cut-out among the one or more recesses or cut-outs.

11. The electronic package according to claim 1,
wherein the electronic circuit comprises one or more transistors integrated in the semiconductor die at or near the upper surface,
wherein the bottom surface is physically connected to the heat-conducting substrate,
wherein the electronic circuit is an RF amplifying circuit,
wherein the one or more transistors comprise one or more RF power transistors, and
wherein the one or more transistors comprise a Silicon-based laterally diffused metal-oxide-semiconductor (LDMOS) transistor or a Gallium Nitride-based field-effect transistor (FET).

12. The electronic package according to claim 11, wherein the semiconductor die comprises a conductive substrate for allowing the one or more transistors to be grounded through the conductive substrate and heat-conducting substrate, or wherein the semiconductor die comprises a substrate in which one or more vias are arranged for allowing the one or more transistors to be grounded through the one or more vias and heat-conducting substrate.

13. The electronic package according claim 1, wherein a thickness of the one or more leads is greater than a thickness of the semiconductor die, wherein a thickness of the one or more leads lies in the range between 0.1 and 0.4 mm, and wherein a thickness of the semiconductor lies in the range between 50 and 200 micrometers.

14. The electronic package according to claim 1, wherein the package body comprises an air cavity in which the semiconductor die and the first end(s) of the one or more leads are arranged.

15. The electronic package according to claim 14, further comprising a spacer element for ensuring that the one or more leads and the heat-conducting substrate are spaced apart.

16. The electronic package according to claim 15, wherein the spacer element comprises a ceramic ring or a thermoplastic ring or wherein the spacer element is formed by a solidified molding compound through which the one or more leads extend.

17. The electronic package according to claim 16, further comprising a package lid connected to the spacer element and delimiting the air cavity.

18. The electronic package according to claim 1, wherein the package body is formed by a solidified molding compound that fills the inside of the package body and that contacts the semiconductor die and the one or more leads.

19. An electronic device, comprising:
the electronic package according to claim 1, wherein the one or more leads each have a mounting end opposite from the first end; and
a printed circuit board comprising:
  a ground pad that is electrically and physically connected to the heat-conducting substrate; and
  one or more signal pads that are electrically and physically connected to the mounting end(s) of the one or more leads.

20. The electronic device according to claim 19, wherein:
the printed circuit board comprises multiple layers, wherein:
  the ground pad is formed at an inner layer and the signal pads are formed at an outer layer; or the ground pad has been exposed to an outside by removal of the layer(s) above the ground pad; or the ground pad is formed by a top surface of a coin that is integrated in the printed circuit board.

* * * * *